United States Patent
Goodwin et al.

(10) Patent No.: US 10,437,825 B2
(45) Date of Patent: Oct. 8, 2019

(54) OPTIMIZED DATA CONDENSER AND METHOD

(71) Applicant: Relican Analytics, Inc., West Allis, WI (US)

(72) Inventors: Andrew J. Goodwin, Jackson, WI (US); Matthew P. Fisher, West Allis, WI (US)

(73) Assignee: Relican Analytics, Inc., West Alis, WI (US)

( * ) Notice: Subject to any disclaimer, the term of this patent is extended or adjusted under 35 U.S.C. 154(b) by 665 days.

(21) Appl. No.: 14/608,799

(22) Filed: Jan. 29, 2015

(65) Prior Publication Data
US 2015/0213092 A1 Jul. 30, 2015

Related U.S. Application Data
(60) Provisional application No. 61/933,104, filed on Jan. 29, 2014.

(51) Int. Cl.
*G06F 16/25* (2019.01)
*G06F 16/2455* (2019.01)
*H03M 7/30* (2006.01)

(52) U.S. Cl.
CPC ...... *G06F 16/24561* (2019.01); *G06F 16/258* (2019.01); *H03M 7/3088* (2013.01)

(58) Field of Classification Search
CPC .................. G06F 17/30501; G06F 16/258
See application file for complete search history.

(56) References Cited

U.S. PATENT DOCUMENTS

| | | | | |
|---|---|---|---|---|
| 4,021,782 A | * | 5/1977 | Hoerning | H03M 7/42 341/51 |
| 5,604,495 A | * | 2/1997 | Watanabe | G06T 9/005 341/106 |

(Continued)

FOREIGN PATENT DOCUMENTS

| | | |
|---|---|---|
| CN | 1238602 | 12/1999 |
| CN | 102132495 | 7/2011 |

(Continued)

OTHER PUBLICATIONS

Acharya, R. U. et al. Simultaneous storage of patient information with medical images in the frequency domain. Computer Methods and Programs in Biomedicine. 2004, 76, 13-19.

(Continued)

*Primary Examiner* — Etienne P Leroux
*Assistant Examiner* — Dara J Glasser
(74) *Attorney, Agent, or Firm* — Christopher M. Scherer; DeWitt LLP

(57) ABSTRACT

A data condenser and method provides lossless condensation of numbers, letters, words, phrases, and other indicia to data object values which results in reduction of file size. The data condenser and method classifies data as individual data objects or groups of data objects and distinguishes terms which repeat (e.g. recur). A reference library is optimized according to the quantity of classified data to minimize storage requirements. The classified data is assigned a unique value which populates the reference file. An output file is created by the data condenser using the reference library to achieve optimal lossless condensation. A data reverter and method provides for reversion of condensed data objects such as numbers, letters, words, phrases and other indicia to uncondensed data objects for efficient and accurate use without loss of data objects.

3 Claims, 3 Drawing Sheets

(56) References Cited

U.S. PATENT DOCUMENTS

| | | |
|---|---|---|
| 7,006,248 B1 | 2/2006 | Okie |
| 7,656,555 B2 | 2/2010 | Okie |
| 7,657,383 B2 | 2/2010 | Allard et al. |
| 7,688,469 B2 | 3/2010 | Okie |
| 7,894,099 B2 | 2/2011 | Okie |
| 8,270,716 B2 | 9/2012 | Fujimoto et al. |
| 8,340,914 B2 | 12/2012 | Gatewood et al. |
| 2003/0005464 A1 | 1/2003 | Gropper |
| 2005/0081145 A1* | 4/2005 | Schwartzkopf ........ G06Q 50/10 715/253 |
| 2005/0267693 A1 | 12/2005 | Allard |
| 2008/0077607 A1 | 3/2008 | Gatawood |
| 2010/0153467 A1* | 6/2010 | Sun ....................... G06F 17/246 707/802 |
| 2010/0299531 A1 | 11/2010 | Webster |
| 2011/0069898 A1 | 3/2011 | Dhand |
| 2012/0089339 A1 | 4/2012 | Ganeshalingam |
| 2012/0167204 A1 | 6/2012 | Akka |
| 2012/0230338 A1 | 9/2012 | Ganeshalingam |
| 2012/0233201 A1 | 9/2012 | Ganeshalingam |
| 2012/0236861 A1 | 9/2012 | Ganeshalingam |
| 2012/0330567 A1 | 12/2012 | Bauer |
| 2013/0031092 A1 | 1/2013 | Bhola |
| 2013/0073490 A1 | 3/2013 | Baughman |
| 2013/0132353 A1 | 5/2013 | Mande |
| 2013/0166518 A1 | 6/2013 | Mande |

FOREIGN PATENT DOCUMENTS

| | | |
|---|---|---|
| EP | 0411232 | 2/1991 |
| EP | 0833519 | 4/1998 |
| EP | 2595076 | 5/2013 |
| WO | 1997001923 | 1/1997 |
| WO | 1997031327 | 8/1997 |
| WO | 2002088895 | 11/2002 |
| WO | 2005088503 | 9/2005 |
| WO | 2006052242 | 5/2006 |
| WO | 2009138938 | 11/2009 |
| WO | 2012031035 | 5/2012 |
| WO | 2012175245 | 12/2012 |

OTHER PUBLICATIONS

Al-Nassiri, A. Text Compression Using Hybrids of BWT and GBAM. International Journal of Neural Systems. 2003, 13 (1), 39-45.
Bhola, V. et al. No-Reference Compression of Genomic Data Stored in FASTQ Format. IEEE International Conference on Bioinformatics and Biomedicine. 2011, 147-150.
Boulgouris, N. V. et al. Orientation-Sensitive Interpolative Pyramids for Lossless and Progressive Image Coding. IEEE Transactions on Image Processing. 2000, 9(4), 710-715.
Gillespy, T. et al. Images on Personal Computers: Displaying Radiologic Images on Personal Computers: Image Storing and Compression—Part 2. 1994, 7(1), 1-12.
Howison, M. High-Throughput Compression of FASTQ Data with SeqDB. IEEE/ACM Transactions on Computational Biology and Bioinformatics. 2013, 10(1), 213-218.
Koff, D. A. et al. An Overview of Digital Compression of Medical Images: Can We Use Lossy Image Compression in Radiology? Canadian Association of Radiologists Journal. 2006, 57(4), 211-217.
Korodi, G. et al. DNA Sequence Compression: Based on the normalized maximum likelihood model. IEEE Signal Processing Magazine. 2007.
Korodi, G. et al. Compression of Annotated Nucleotide Sequences. IEEE/ACM Transactions on Computational Biology and Bioinformatics. 2007, 4(3), 447-457.
Lippert, R. A. et al. A Space-Efficient Construction of the Burrows-Wheeler Transform for Genomic Data. Journal of Computational Biology. 2005, 12(7), 943-951.
Muller, H. et al. A Review of Content-Based Image Retrieval Systems in Medical Applications—Clinical Benefits and Future Directions. International Journal of Medical Informatics. 2004, 73(1), 1-23.
Okkalides, D. Assessment of commercial compression algorithms, of the lossy DCT and lossless types, applied to diagnostic digital image files. Computerized Medical Imaging and Graphics. 1998, 22, 25-30.
Shanker, A. Genome Research in the Cloud. OMICS A Journal of Integrative Biology. 2012, 16(7-8), 422-428.
Ye, Y. et al. Fast and Memory Efficient Text Image Compression With JBIG2. IEEE Transactions on Image Processing. 2003, 12(8), 944-956.
Bao, "Evaluation of next-generation sequencing software in mapping and assembly", Journal of Human Genetics, 2011, 1-9.
Behzadi, "DNA compression challenge revisited: a dynamic programming approach", LIX, Ecole Polytechnique, Paris France, Jun. 21, 2005, 1-38.
Bonfield, "Compression of FASTQ and SAM format sequencing data", PLOS One, Mar. 2013, 8(3):e59190.
Bose, "BIND—An algorithm for loss-less compression of nucleotide sequence data", J. Biosci., Sep. 2012, 37 (4):785-789.
Brandon, "Data structures and compression algorithms for genomic sequence data", 2009, 25(14):1731-1738.
Cao, "A simple statistical algorthm for biological sequence compression", Data Compression Conference, Mar. 27-29, 2007, 43-52.
Chanda, "HapZipper: sharing HapMap populations just got easier", Nucleic Acids Research, 2012, 40(20):e159.
Chen, "DNACompress: fast and effective DNA sequence compression", Bioinformatics, 2002, 18(12):1696-1698.
Christley, "Human genomes as email attachments", Bioinformatics, 2009, 25(2):274-275.
Cox, "Large-scale compression of genomic sequence databases with the Burrows-Wheeler transform", Bioinformatics, Jun. 2012, 28(11):1415-1419.
Deorowicz, "Compression of DNA sequence reads in FASTQ format", Bioinformatics, 2011, 27(6):860-862.
Deorowicz, "Robust relative compression of genomes with random access", Bioinformatics, 2011, 27 (21):2979-2986.
Fidler, "Lossy JPEG compression: easy to compress, hard to compare", Dentomaxillofacial Radiology, 2006, 35: 67-73.
Fritz, "Efficient storage of high throughput DNA sequencing data using reference-based compression", Genome Research, 2011, 21:734-740.
Hach, "SCALCE: Boosting sequence compression algorithms using locally consistent encoding", Bioinformatics, 2012, 28(23):3051-3057.
Haneda, "Text segmentation for MRC document compression", IEEE Transactions on Image Processing, Jun. 2011, 20(6):1611.
Heikkinen, "Dictionary-based program compression on transport triggered architectures", Internet Article, 2005, http://www.cs.tut.fi/~move/doc/ISCAS05.pdf, retrieved Mar. 25, 2015.
Hilbert, The world's technological capacity to store, communicate, and compute information, Science, 2011, 332:60.
Jones, "Compression of next-generation sequencing reads aided by highly efficient de novo assembly", Nucleic Acids Research, 2012, 40(22):e171.
Kozantis, "Compressing genomic sequence fragments using SLIMGENE", Journal of Computational Biology, 2011, 18(3):401-413.
Lam, "Compressed indexing and local alignment of DNA", Bioinformatics, 2008, 24(6):791-797.
Li, "A survey of sequence alignment algorithms for next-generation sequencing", Briefings in Bioinformatics, May 2010, 11(5):473-483.
Makinen, "Storage and retrieval of highly repetitive sequence collections", Journal of Computational Biology, 2010, 17(3):281-308.
Manzini, A simple and fast DNA compressor, Software: Practice and Experience, 2004, 34:1397-1411.
Mohammed, "Deliminate—A fast and efficient method for loss-less compression of genomic sequences", 2012, 28 (19):2527-2529.

(56) References Cited

OTHER PUBLICATIONS

Pinho, "GReEn: A tool for efficient compression of genome resequencing data", Nucleic Acids Research, 2012, 40(4): e27.
Popitsch, "NGC: Lossless and lossy compression of aligned high-throughput sequencing data", Nucleic Acids Research, 2013, 41(1):e27.
Ruffalo, "Comparative analysis of algorithms for next-generation sequencing read alignment", Bioinformatics, 2011, 27(20):2790-2796.
Schmieder, "Quality control and preprocessing of metagenomic datasets", Bioinformatics, 2011, 27(6):863-864.
Wan, "Transformations for the compression of FASTQ quality scores of next-generation sequencing data", Bioinformatics, 2012, 28(5):628-635.
Wang, "A novel compression tool for efficient storage of genome resequencing data", Nucleic Acids Research, 2011, 39(7):e45.
International Search Report for PCT/US2015/013424 dated Mar. 25, 2015.
Examination report for Australian Patent Application No. 2015211043 dated May 8, 2018.

\* cited by examiner

OPTIMIZED DATA CONDENSER AND METHOD

CROSS REFERENCE TO RELATED APPLICATIONS

The present application claims priority of U.S. Provisional Patent Application No. 61/933,104, filed Jan. 29, 2014, the content of which is incorporated herein by reference in its entirety.

BACKGROUND

Data storage is a central issue for researchers and others facing the daunting challenge of interpreting vast genomic and other datasets in the terabyte, petabyte range and beyond. Collaboration and the critical sharing of data such as between research and clinical facilities (both local and remote) requires the handling of a huge influx of datasets and requires strategies for lossless data compression to enable efficient and accurate comparison such as log files or a reference genome, which are federally required for audit and reporting purposes. Data storage and secure transfer of the same has been accomplished by sending physical hard drives to local or distant locations, which is cumbersome, expensive and increasingly unsustainable.

Freely available research-based tools exist as do other applications and publications in fields related to algorithms and methods for selective compression, coding, indexing, annotation, mapping, and alignment of large data files including, but not limited to: repetitive sequence collections, text, binary text images, and databases.

Rapid improvements in high-throughput next generation sequencing technologies yield genomic datasets (both complete genomes and population-type) that are accumulating at an exponential rate. Publicly available genomic datasets are typically stored as flat text files with increasing burdens for digital storage, analysis, and secure transmission. Storing, sharing, analyzing, or downloading large data files such as genetic information or other Big Data remotely is laborious and nearly impossible for many institutions, especially those in parts of the world lacking high-speed internet access. Today, large storage sites spend millions of dollars on storage, and massive data transfer remains an imposing burden on servers and internet networks. There exists an urgent technical need for a solution to enable the storing, sharing, transmission, etc. of large datasets without the loss or deterioration of data. With present technologies, this is at best laborious and, in many cases, nearly impossible for many entities, such as institutions, especially research centers, hospitals and others.

SUMMARY

An optimized data condenser and method reduces the burden on storage media, such as but not limited to, disk, solid state, or any form of storage media, fixed or portable, along with data transfer overheads associated with the storage of data, such as derived from next generation whole genome sequencing. Input files could include, without limitation, BLAST formats, log/error files, databases, and other common file formats.

The optimized data condenser and method condenses data, such as numbers, letters, words, phrases, and other indicia also known as data objects, to one or more values defined by manually defined and/or automatically optimized Hexadecimal, Duocentosexapentagesimal (Base-256), or other NBase value(s). NBase (Nb) is defined as a variable numerical base system that has a minimum measure of two base units (Binary) and no upper numerical base limit. As necessary, a complete reversion of this new condensed Hexadecimal, Base-256, or other NBase file can be decoded to return the data to the original format, without any loss of data. For clarity, the condensation process is not compression as seen in some zip archives, but rather a condensation that leads to a condensed file size.

A library contains one or more reference files. Each reference file contains data and/or groupings of data with associated assigned unique Hexadecimal, Base-256, or other NBase codes used to correlate with identified data objects. Such identified data objects as well as duplicated (i.e. repeated) and other data objects not found in the library (which are assigned an associated unique code) are added to an optimized version of the original reference files contained in the library.

The produced Hexadecimal, Base-256, or other NBase values associated with the assigned codes are stored in a formatted reference file(s) wherein a data object is associated with a unique Hexadecimal, Base-256, or other NBase value that can be located via a simple request (e.g. X, Y axis). Condensed files have the ability to expand both horizontally and vertically unlike a text document or data base that has defined and limited columns that require added pages to expand. Condensed files are stored in lossless formats. This allows for data objects to be assigned Hexadecimal, Base-256, or other NBase values within the condensed file(s). Specific use and general use versions can be designed by modifying the reference file(s), while the core engine remains the same. Selection of a structured format based on file size may further optimize file storage and handling.

The condensed file(s) effectively hides the true nature of the embedded data objects since various Hexadecimal, Base-256, or other NBase values that are used to represent the data objects in the file(s) cannot easily be discerned, thereby providing a natural state encryption. Even if the Hexadecimal, Base-256, or other NBase values are differentiated through use of computer analysis, there is no way to tell which data objects they represent, or if an alternate order of alignment has been applied. While the condensed file(s) may be created on an X, Y axis and by default is populated left to right, top to bottom, there is nothing limiting the data condenser and method to starting in the middle and populate counter clockwise or any other starting place and/or method of population.

In one aspect of the present application, a lossless data condenser for reducing data storage and handling requirements comprises a data memory including a source file having data objects to be condensed, a predetermined reference file having predetermined data objects and predetermined data object groups, an advanced reference file having algorithmically selected data objects and algorithmically selected data object groups obtained from at least one of the source file and the predetermined reference file, a condensation file including condensed data objects and condensed data object groups, and an array file including an array of the condensed data objects and the condensed data object groups, and a condensation processor operative to select at least one numerical base coding system based at least in part on a count of the data objects, select a pack depth for the array file based at least in part on the count of the data objects, limit the at least one numerical base coding system based at least in part on the count of the data objects, analyze the data objects in the source file to locate one or more recurring data objects and recurring data object groups, assign a first unique code to the data objects and data object groups in the predetermined reference file, assign a second unique code to a selected recurring and a selected non-recurring data objects and data object groups in the advanced reference file, place the coded data objects and the coded data object groups in the condensation file, and build an array of the condensed data objects in the array file, wherein the lossless data condenser allows efficient and accurate lossless data storage and transfer, wherein the condensation processor has a base-256 coding system assigned to predetermined data objects and data object groups and a base-16 coding system assigned to non-predetermined data objects and data object groups, and the memory array is defined by the square root of the total number of coded data objects and data object groups rounded up if necessary to a whole number with null data objects filling the array if necessary.

In another aspect of the present application, an apparatus for performing lossless condensation operations comprises a data source memory having at least one data file including input data of data objects, a condensation processor configured to differentiate a group of data objects from a single data object and to differentiate a repeating group of data objects that repeat beyond a selected threshold value, and a reference library including a customized file including pre-defined data objects and predetermined data object groups, wherein the condensation processor is further configured to assign a unique code to the repeating repetitive and a non-repeating data object and data object group to provide a condensed file.

In another aspect of the present application, a lossless data condenser for reducing data storage and handling requirements comprises a data source memory having at least one data file containing input data of data objects, a condensation memory having data object groups each containing one or more data objects according to repetitive patterns of data objects in the data source memory, a condensation processor operative to select at least one of a plurality of numerical base coding systems based on the number of data objects and groups of data objects in the data source memory, a customized reference library memory having pre-defined data objects and pre-defined data object groups assigned a unique code from at least one of the selected numerical base coding systems, and a formulated reference library memory having recurring and non-recurring data objects and groups of data objects assigned a unique code from at least one of the numerical base coding systems together with selected coded predefined data object groups, and the formulated reference library memory having a memory array defined by the square root of the total number of coded data objects and data object groups rounded up if necessary to a whole number with null data objects filling the array if necessary, with the memory array pack depth based on a count of the total number of coded data objects and data object groups in the formulated reference library.

In another aspect of the present application, a lossless data condenser for reducing data storage and handling requirements comprises a data memory having at least one source file storing input data including a plurality of recurring and non-recurring data objects to be condensed, an interface memory operative to receive and read data objects from input data, a reference library storing coded values related to corresponding data objects, a condensation processor connected to the reference library to optimize the input data, and a condensation memory connected to receive optimized input data and provide condensed output data.

In another aspect of the present application, a lossless data condensation system comprises a condensation processor configured to select at least one numerical base coding system from a plurality of numerical base coding systems based on the number of repetitive patterns of data object groups and assign a unique code from the at least one of the selected numerical base coding systems to each data object group, and a condensation memory having coded data object groups to provide condensed data storage and data transfer.

In another aspect of the present application, a lossless data condensation system comprises condensation processor configured to assign unique code to data object groups containing repetitive patterns of data objects, and a memory array storing coded data object groups having a pack depth selected to reduce storage requirements for the memory array.

In another aspect of the present application, an apparatus to revert condensed data objects to uncondensed form comprises a data memory including a condensation file having condensed data objects, at least one destination mode for uncondensed data objects, a reference file having coded recurring and non-recurring condensed data objects and information identifying at least one or more numerical coding systems and the pack depth if applicable associated with the condensation file, and a reversion processor operative to select at least a portion of the condensed data objects to revert, select the destination mode for the use of uncondensed data objects, and link the condensation file with the reference file to revert the condensed data objects to uncondensed data objects for efficient and accurate use without loss of the data objects.

In another aspect of the present application, a method for lossless data condensation of data objects such as numbers, letters, words, phrases and other indicia to allow efficient and accurate secure data evaluation, data storage and data transfer, comprises obtaining a collection of data objects to be condensed, placing the collection of data objects into a source file, conducting an analysis of the source file including counting the total number of data objects, reading the source file and creating data object groups each containing one or more data objects in response to repetitive patterns of data objects within the source file, counting the total number of data object groups, selecting one or more numerical base coding systems based on a selected quantity of data object groups, establishing one or more library reference files of pre-defined data object groups, assigning a first unique code from the selected coding system to each pre-defined data object group, identifying individual recurring groups of data objects as distinguished from non-recurring groups of data objects, assigning a second unique code from the selected coding system to each recurring and non-recurring group of data objects which are not pre-defined data object groups, placing coded data object groups into one or more library reference files, reading the source file and counting the total number of coded data object groups, selecting the pack depth for a memory array, forming the memory array defined by the square root of the total number of selected coded data object groups and rounding up if necessary to establish a whole number, adding null coded data objects to fill the array, and placing the array on storage media.

In another aspect of the present application, a method of condensing data to provide reduced data storage and handling comprises reading a data file containing a plurality of data objects, identifying recurring data object groups each containing one or more data objects as distinguished from non-recurring data object groups, assigning a code to each recurring and non-recurring group of data objects, formulating a reference library of optimum size, and placing the coded data object groups in the reference library for data storage and handling.

In another aspect of the present application, a method for lossless data reversion of condensed data objects such as numbers, letters, words, phrases and other indicia comprises obtaining a condensation file of condensed data objects, selecting at least a portion of the condensed data objects to revert, selecting a destination mode for reverted data objects, obtaining a reference file having code assigned to recurring and non-recurring condensed data objects, the reference file having information identifying at least one or more numerical coding systems and the pack depth if applicable associated with the condensation file, and reading the condensation file based on links with the reference file to revert the condensed data objects to uncondensed data objects for efficient and accurate use without loss of the data objects.

DETAILED DISCLOSURE

Figure 1:
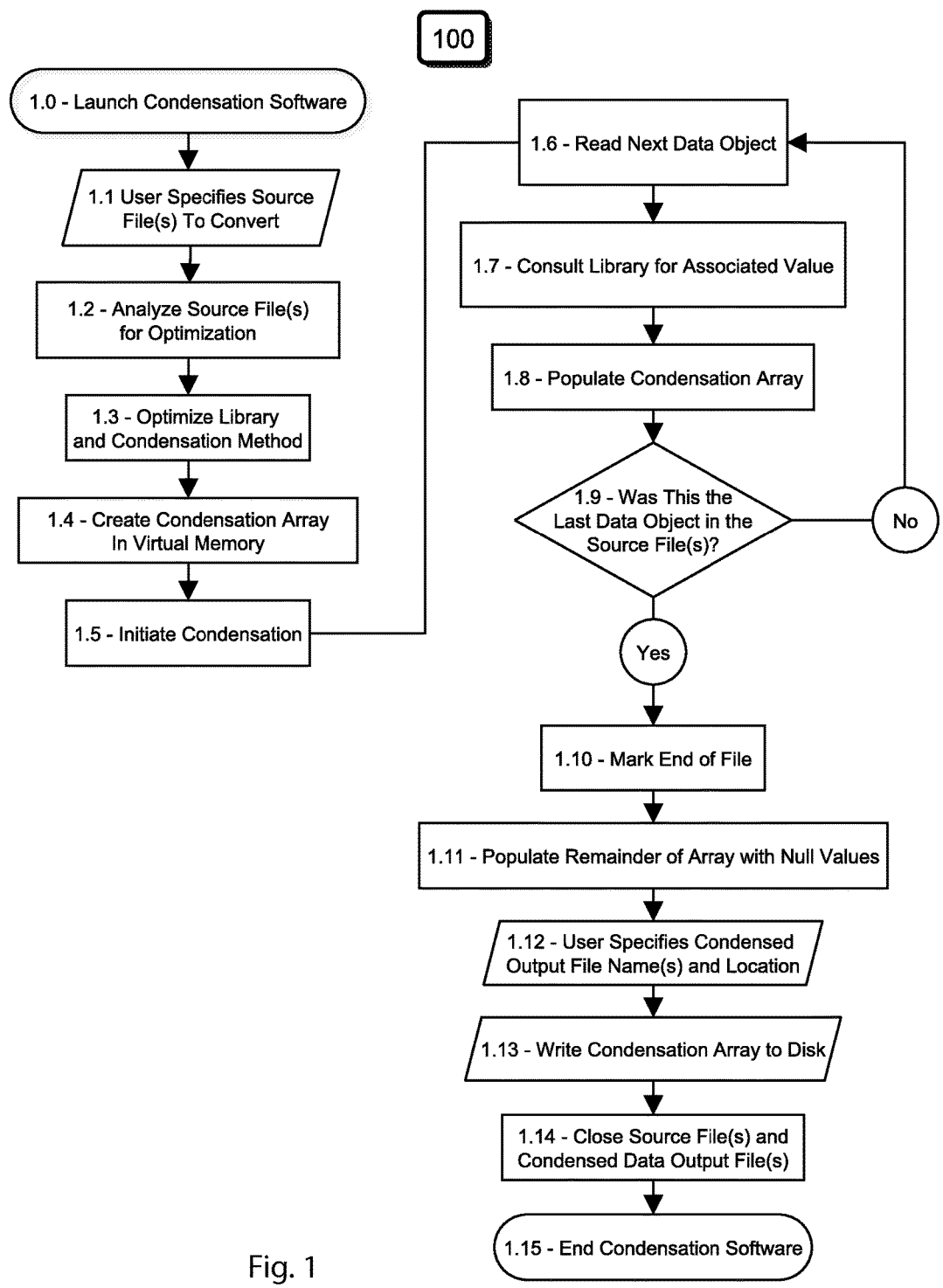
FIG. 1 is a flow chart that depicts an embodiment of a method of condensation of data files of the present application.

In the present description, certain terms have been used for brevity, clearness and understanding. No unnecessary limitations are to be applied therefrom beyond the requirement of the prior art because such terms are used for descriptive purposes only and are intended to be broadly construed. The different systems and methods described herein may be used alone or in combination with other systems and methods. Various equivalents, alternatives and modifications are possible within the scope of the appended claims. Each limitation in the appended claims is intended to invoke interpretation under 35 U.S.C. § 112, sixth paragraph, only if the terms "means for" or "step for" are explicitly recited in the respective limitation.

In the following detailed description, reference is made to the accompanying drawings that form a part hereof, and in which is shown by way of illustration specific embodiments that may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken as limiting the scope of the invention.

The system and method of the present application utilizes lossless condensation (which results in reduction of file size) of data which condenses single numbers, letters, words, phrases, and other indicia to Hexadecimal, Base-256, or other NBase values which are agnostic to sequencing techniques to form one or more condensed files. The system and method of the present application utilizes lossless condensed files to retain their ability to be read from and written to. The system and method of the present application utilizes a lossless condensed files to be reverted to their previous original uncondensed state for use in applications that are unable to interact with a condensation file(s) (or array file(s)). Thus, the system and method of the present application utilizes apparatus and system which: (a) significantly reduces storage requirements, particularly for large data files; (b) allows faster data transmission, particularly of large text or database files; (c) allows the inclusion of other data (e.g. electronic medical records, clinical metadata, relevant audit logs, etc. with minimal increase in file size; (d) allows rapid analysis and modification of the condensed files; (e) provides natural state encryption; and/or (f) serves as a platform for further development leading to the ability to implement GPU-based processing and mathematical/scientific analysis. The smaller file sizes of condensed data allows for large files frequently stored on specialized systems to now be more widely stored on smaller capacity systems, and also reduces network traffic or required bandwidth in communications.

The term "data object" may be used in its broadest sense to include the smallest single component represented by alpha-numeric (i.e. digital) values that are carried by electronic signals. Each data object is assigned one or more Hexadecimal, Base-256, or other NBase (i.e. digital) values.

The term "pack depth" is used to define the number of Base-16, Base-256 or other NBase data objects that are packed (stored) in an array file. Pack depth must be a positive integer +i in value and can be set to a default of greater than or equal to one ($\geq 1$) by the system or manually set to a value of greater than or equal one ($\geq 1$) at time of conversion to a condensed form.

The technical advantage or technical effect of the optimized condenser described herein is that the condensed file sizes are an extremely smaller fraction of the original file size, than is achieved in current compression systems, that operate much differently. Some obvious examples of where this is not only useful, but actually necessary include, but are not limited to, genetics.

Most current computers employ binary digits (i.e. "bits"), also known as "base-2". Some computers operate using 8 bit collections (i.e. "bytes") each having 256 values. When using ASCII (Unicode) format, values 0 to 127 generally relate to specific characters, while values 128 to 255 generally relate to special items, such as accent characters from foreign languages. Notepad in Windows uses one byte of memory per character or space. The optimized data condenser and methods disclosed herein may use various numerical based systems, such as Hexadecimal, Base-256 or other NBase, manually or automatically selected for optimization and is not restricted to base-16, described earlier as hexadecimal, provided in the examples contained within.

If a binary base-2 system is employed, each data object can include one bit or a plurality of bits to define values, as measured by bits or in the case of a collection of 8 bits, a byte. Hexadecimal is a base-16 system and each singular hexadecimal value is equal to 4 bits of binary code. For example and without limitation:

1 Hexadecimal value=16 potential data objects or 4 bits
2 Hexadecimal values=256 potential data objects or 8 bits/1 byte
3 Hexadecimal values=4096 potential data objects or 12 bits
4 Hexadecimal values=65536 potential data objects or 16 bits/2 bytes
5 Hexadecimal values=1048576 potential data objects or 20 bits
6 Hexadecimal values=16777218 potential data objects or 24 bits/3 bytes 7 Hexadecimal values=268435456 potential data objects or 28 bits 8 Hexadecimal values=4294967296 potential data objects or 32 bits/4 bytes It takes one-fourth (¼) of the space in hexadecimal to represent the same number of data objects in binary.

In another embodiment, if a binary base-2 system is employed, each data object can include one bit or a plurality of bits to define values, as measured by bits or in the case of a collection of 8 bits, a byte. Duocentosexapentagesimal is a base-256 system and each singular value is equal to 8 bits of binary code. For example and without limitation:

1 Duocentosexapentagesimal value=256 potential data objects or 8 bits/1 byte

2 Duocentosexapentagesimal values=65536 potential data objects or 16 bits/2 bytes 3 Duocentosexapentagesimal values=16777216 potential data objects or 24 bits/3 bytes 4 Duocentosexapentagesimal values=4294967296 potential data objects or 32 bits/4 bytes In another embodiment, if a binary base-2 system is employed, each data object can include one bit or a plurality of bits to define values, as measured by bits or in the case of a collection of 8 bits, a byte. NBase is a variable base system, base-N, where N is defined as any positive integer (+i) greater than or equal to one (≥1) and each singular value is a positive integer (+i) greater than or equal to one (≥1) bit/s of binary code. The data objects may be condensed by pack depth where pack depth is a positive integer (+i) greater than or equal to one (≥1).

1 NBase value≥+$i$ data object/s and ≥+$i$ bit/s in a+$i$ Packdepth

Figure 2:
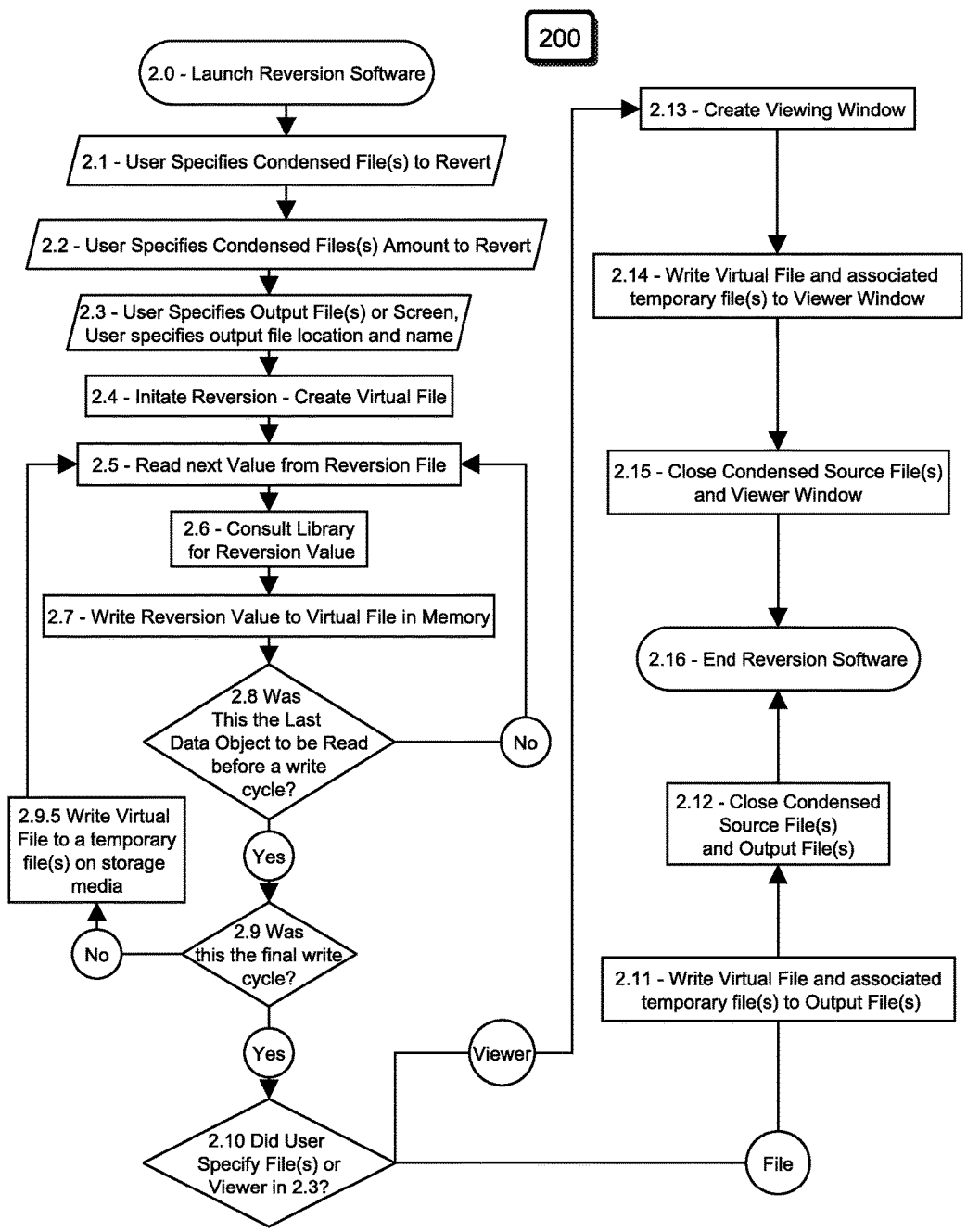
FIG. 2 is a flow chart that depicts an embodiment of a method of reversion of a condensed file to its original un-condensed state of the present application.
Figure 3:
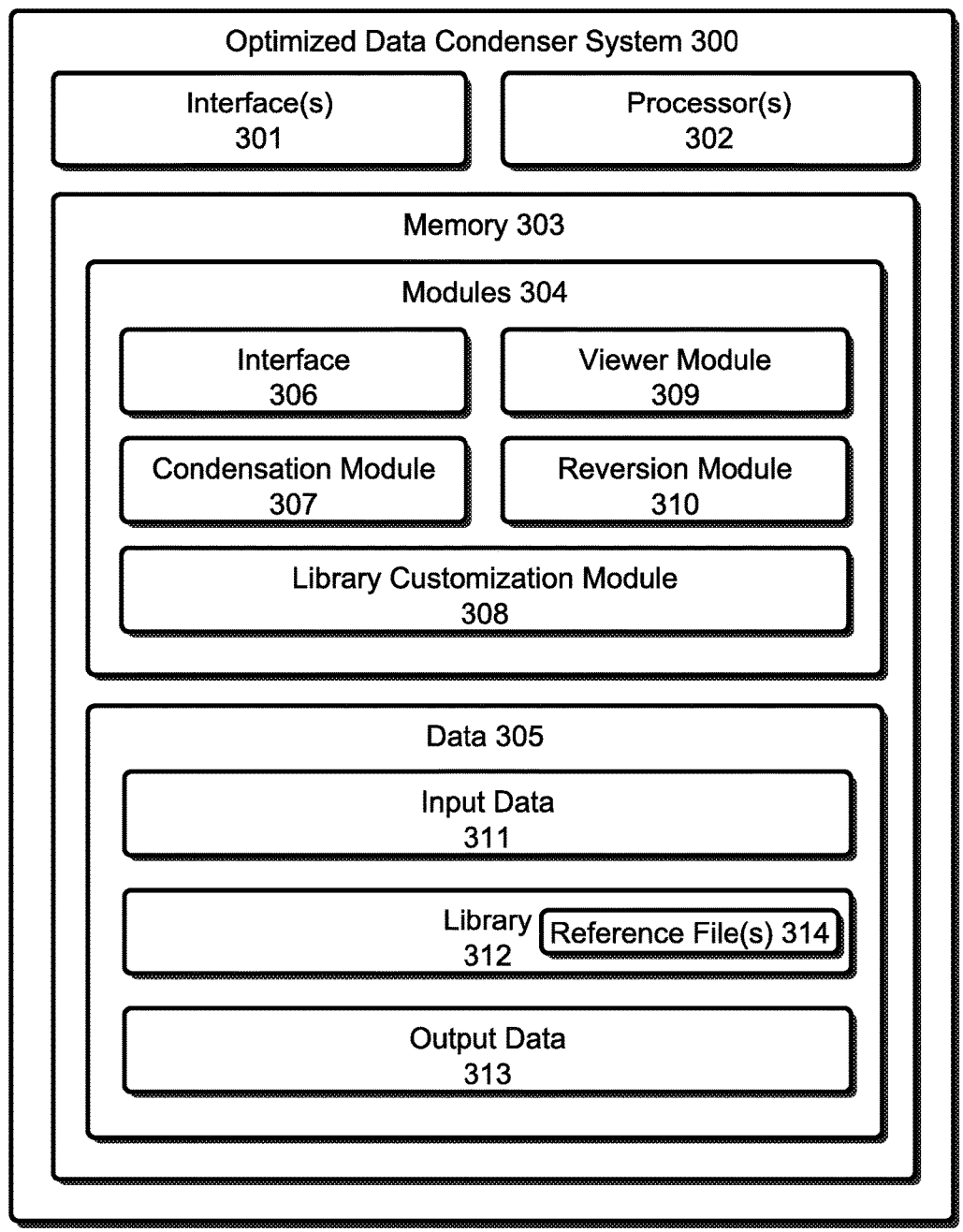
FIG. 3 is a system diagram of an exemplary embodiment of an optimized data condenser system of the present application.

FIGS. 1 and 2 are flow charts that respectively depict exemplary embodiments of a method 100 to condense data files to a substantially smaller size and a method 200 of reversion of the smaller size files to the original data file(s) size without loss of data (i.e. lossless). The optimized data condenser system 300 illustrated in FIG. 3 is generally a computing system that may include, but are not limited to, desktop computers, hand-held devices, multiprocessor systems, personal digital assistants (PDAs), laptops, network computers, cloud servers, minicomputers, mainframe computers, and the like. The condenser system 300 includes interface(s) 301, one or more processor(s) 302, and a memory 303 coupled to the processor(s) 302. The processor(s) 302 loads and executes software from the memory 303. When executed by the condenser system 300, module 304 directs the process(s) 302 to operate as described with the method of condensation 100 or method of reversion 200 described herein.

Interface 301 can include a mouse, a keyboard, a voice input device, a touch input device for receiving a gesture from a user, a motion input device for detecting non-touch gestures and other motions by a user, and other comparable input devices and associated processing elements capable of receiving user input from a user. Output devices such as a video display or graphical display can display an interface further associated with embodiments of the system and method as disclosed herein. Speakers, printers, haptic devices and other types of output devices may also be included in the user interface 301. Further, the interface(s) 301 may enable the system 300 to communicate with other devices, such as web servers and external databases. The interface(s) 301 can facilitate multiple communications within a wide variety of networks and protocol types, including wired networks, for example, local area network (LAN), cable, etc., and wireless networks, such as Wireless LAN (WLAN), cellular, or satellite. For the purpose, the interface(s) 301 may include one or more ports for connecting a number of computing systems with one another or to another server computer.

The processor(s) 302 can be a single processing unit or a number of units, all of which could include multiple computing units. The processor 302 may be implemented as one or more microprocessors, microcomputers, microcontrollers, digital signal processors, central processing units, state machines, logic circuitries, and/or any devices that manipulate signals based on operational instructions. Among other capabilities, the processor(s) 302 is configured to fetch and execute computer-readable instructions and data stored in the memory 303.

The memory 303 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 303 also includes module(s) 304 and data 305.

The modules 304, amongst other things, include routines, programs, objects, components, data structures, etc., which perform particular tasks or implement particular data types. The modules 304 further include an interface module 306, a condensation module 307, a library customization module 308, a visual viewer module 309, a reversion module 310, and possibly other modules as needed. The other modules may include programs that supplement applications on the system 300, for example, programs in the operating system. On the other hand, the data memory 305 serves, amongst other things, as a repository for storing data processed, received, and generated by one or more of the modules 304. The data memory 305 includes input data 311, which could include a source file, library data 312 consisting of reference files 314 such as a predetermined reference file and/or an advanced reference file, and output data 313 such as within a condensation file and/or an array file. The output data 313 includes data generated as a result of the execution of one or more of the above modules.

For condensation the system 300 is associated with input data 311. The input data 311, such as a source file, may include, but are not limited to, text, image, spreadsheet, or database formats, and are chosen by interface module 306 and provided to the system 300 for condensing via module 307. Module 307 will optionally activate the library customization module 308 to analyze the input data 311 and optimize the library 312. The condensation module 307 will then use the library 312 to condense the input data 311 into output data 313. The interface module 306 returns the output data 313 as a condensation file(s) (or array file(s)) of data 305 which may be accessed from fixed or portable storage media in memory 303.

For reversion, the system 300 is associated with input data 311, such as a condensation file. The input data in this case is a condensation file(s) (or array file(s)) produced in the process as detailed above. The input data 311 is chosen by interface module 306 and is provided to the system 300 for reversion via module 310. The interface module 306 will offer a destination mode option to revert to either file or screen. If file is chosen, the interface module 306 will activate the reversion module 310. The reversion module 310 will use a reference file(s) from the library 312 to revert the input data 311 into output data 313. The interface module 306 returns the output data 313 as a file of data 305 which may include but is not limited to text, image, spreadsheet, or database formats, and may be accessed from fixed or portable storage media in memory 303. If screen is chosen, the interface module 306 will activate the reversion module 310. The reversion module 310 will use a reference file(s) from the library 312 to revert the input data 311 into output data 313. The interface module 306 returns the output data 313 to visual viewer module 309 which uses interface module 301 to display the output data 313 on a computer monitor or other device capable of display in a visually uncondensed viewable format.

In conjunction with the condensation module 307, the processor(s) 302 reads all forms of data, such as letters, numbers, spaces, etc. in the source file, and distinguishes the spaces from the other types of data (e.g. letters, numbers, etc.). In conjunction with the condensation module 307, the processor(s) 302 then determines the number of times that data object(s) are repeated (e.g. recurs) within the entire source file.

Based on this data, the processor(s) 302 edits the source file or produces an advanced reference file(s) and add such reference file(s) to the library. Data object(s) recurring more than once will be added to the advanced reference file(s). The amount of times (threshold) that a data object(s) must appear in order to be added may be manually defined by the user or automatically determined by the condensation module 307.

For example, the data condenser might determine that beyond the common 128 values used for specific characters when using ASCII (Unicode) format, 20 terms have 5 characters that repeat 20 times, 15 terms have 10 characters that repeat 15 times, and 5 terms have 50 characters that repeat 5 times. During this process, the data condenser determines that there are a total of 40 internal structures that meet the threshold requirements beyond the 128 common specific characters within the ASCII format.

The following provides examples of optimization for 5, 10 and 50 characters found in a data file utilizing the embodiment of the hexadecimal method:

| 5 Character Terms Data Objects (20) where 'r' refers to number of repeats. | | | |
|---|---|---|---|
| Term 01 - r150 | Term 02 - r100 | Term 03 - r50 | Term 04 - r80 |
| Term 05 - r150 | Term 06 - r120 | Term 07 - r170 | Term 08 - r90 |
| Term 09 - r70 | Term 10 - r140 | Term 11 - r130 | Term 12 - r50 |
| Term 13 - r90 | Term 14 - r70 | Term 15 - r210 | Term 16 - r180 |
| Term 17 - r160 | Term 18 - r210 | Term 19 - r330 | Term 20 - r60 |

Each term is written once to the library 312 as the 1:1 of the term data object and will represent the recursive term that was counted past the threshold. Each term data object will require an identification hexadecimal data object plus a pointer hexadecimal data object. This will require (20×5)+20 hexadecimal data objects, or 120 total hexadecimal data objects.

| 10 Character Terms (15) where 'r' refers to number of repeats. | | |
|---|---|---|
| Term 01 - r 150 | Term 02 - r100 | Term 03 - r50 |
| Term 04 - r80 | Term 05 - r150 | Term 06 - r 120 |
| Term 07 - r170 | Term 08 - r90 | Term 09 - r70 |
| Term 10 - r140 | Term 11 - r 130 | Term 12 - r50 |
| Term 13 - r90 | Term 14 - r70 | Term 15 - r210 |

Each term is written once to the library 312 as the 1:1 of the term and will represent the recursive term that was counted past the threshold. Each term will require an identification hexadecimal data object plus a pointer hexadecimal data object. This will require (15×10)+15 hexadecimal data objects, or 165 total hexadecimal data objects.

50 Character Terms (5) where 'r' Refers to Number of Repeats.

Term 01—r70 Term 02—r50 Term 01—r90 Term 01—r80 Term 01—r60 Each term is written once to the library 312 as the 1:1 of the term and will represent the recursive term that was counted past the threshold. Each term will require an identification hexadecimal data object plus a pointer hexadecimal data object. This will require (5×50)+5 (bits) hexadecimal data objects, or 255 total hexadecimal data objects.

For recursion optimization limited to terms of 5, 10 and 50 characters as illustrated above, the total content written to the library 312 is 120+165+255 for a grand total of 540 hexadecimal data objects that will be supplied to the virtual memory prefix file. Such illustrated recursion process thus replaces 52,500 characters with 540 hexadecimal data objects in condensed data.

Instead of using threshold optimization, such as by limiting the recursion process to terms of 5, 10 and 50 characters, the data condenser and method could sense all recursions of two or more characters which would result in a significant reduction in the total number of hexadecimal (or other NBase) data objects required to be used and still provide a lossless condensation of the entire file.

Each identified, non-repeating single character or group of characters is associated with a single hexadecimal (or other NBase) data object. In the case of a misspelled word, the system checks the letters of the purported word until it is no longer able to continue; then condenses the single letters to hexadecimal (or other NBase) data objects, instead of the full word. This allows for the compensation of internal data object errors and imperfections without software fault or errant output.

At the completion of the recursion process, the data condenser and method performs a second count of the condensed data contained in the library 312 which is generally a number which is significantly reduced from the initial count due to the recursion.

An optimized library may use a condensation file(s) which is used for storing the entities identified through recursion, and is optimized to reduce the capacity requirements for storing the condensed data. If using a square condensed array file, for example, the data condenser and method determines the square root of the total count of condensed data. If the square root includes a numerical fraction, the square root number is adjusted to the next higher whole number to prevent loss of data. For example, the square root of 456,840 is 675.8×675.8. However, the data condenser and method rounds up to 676×676 (next closest whole number rounded up). The array file is thereafter populated with all of the hexadecimal, Base-256, or other NBase data objects from the condensation file(s), with the remaining space filled by non-value (e.g. null) data objects until the end of file.

In hexadecimal embodiment, the data condenser and method provides, but is not limited to, a number of predetermined hexadecimal data objects designated by the number of individual hexadecimal values. Described for brevity as "Hex Per Object" (HPO), such formats may be automatically and/or manually selected based on the condensed data to further optimize data handling and storage.

| Hexadecimal Data Object Example | Decimal Equivalent | Hex Per Object | Maximum Values |
|---|---|---|---|
| B | (11 in decimal) | 1 hpo | 16 |
| 1C | (28 in decimal) | 2 hpo | 256 |
| F7A | (3962 in decimal) | 3 hpo | 4,096 |
| 4AF6 | (19190 in decimal) | 4 hpo | 65,536 |
| FFA75 | (1047157 in decimal) | 5 hpo | 1,048,576 |
| A7B9E5 | (10992101 in decimal) | 6 hpo | 16,777,216 |
| . . . and so on | | | |

The data condenser and method will thus condense the storage requirements by selecting a structured format for further optimization. For example, utilization of 16,777,216 values provided by the 6 hpo format may be far too many to be efficiently optimized. If it is assumed that the English language has approximately 130,000 common words including variable versions (ing, ed, est . . . etc.), use of the 4 hpo format (65,536 values) is too small. Rather, the data condenser and method may select the 5 hpo format 1,048,576 values as the optimized format. As another example, the exon/intron genomic sequences span approximately 45,000,000 to 260,000,000 characters in length, at a data mass balance of approximately 1,000,000 bits per 1,000,000 characters. In a genomic sequence, there are only eight possible characters, plus a null/non-read (N), and the end of file. There is no need to use 2 hpo, 4 hpo, or 6 hpo formats. Rather, the 1 hpo format providing 16 values is more than sufficient. With only eight total characters in a genomic sequence, a heavy pattern of recursion occurs, and optimization is therefore determined and provided directly to a predetermined reference file 314 or the library 312. Chromosome 16, for example, contains approximately 88,827,255 genetic base pairs. When placed in a text file, approximately 88,830,625 bits may be required, including associated file information. When condensed by the data condenser and method, the file size is automatically adjusted to 9425×9424 with no base pairs lost. The selection of the 1 hpo format results in file reduction to 2,683,293 bits, which is approximately 3% of the original size.

The data condenser and method may provide one or more predetermined reference files containing pre-defined data objects. The data condenser and method correlates identified repetitive data objects in each source file with pre-determined data objects in the predetermined reference file to thereby form an advanced reference file. The new data objects located in the advanced reference file are assigned unique hexadecimal (or other NBase) values with such new data objects added to a new condensation file. In either event, using the data condenser and method adds digital pointers to each data object in the condensation file. For example, one predetermined reference file could contain 130,000 common English words with a 5 hpo format providing 1,048,576 values. Another predetermined reference file could contain the exon/intron genomic sequence for full chromosomes with a 1 hpo format providing 16 values. Another predetermined reference file could contain a FastQ multi-variable format with a 3 hpo format providing 4096 values. Another predetermined reference file could include common languages with variations for each common language in the world. Optimization could be provided for predetermined reference files at or above the 5 hpo format. Carriage returns, null areas such as end of file or end of line, cell notations, columns, rows, tabs, etc. may be built into the common and/or FastQ libraries.

Predetermined reference files can be structured to allow multiple data objects to merge so as to be designated by a single hexadecimal (or NBase) data object. Thus, values from two (or more) related but not identical sliding scales can be merged. When working with genomic data, for example, a base pair "A" (Adenine) may be combined with a Phred score of "#" within a tolerance of a specific link and location to create one value identified by a single hexadecimal (or NBase) data object.

The data condenser and method assigns a unique hexadecimal (or NBase) object code to each of the condensation file (e.g. predetermined and/or advanced reference files). As an example, the data "O say can you see by the dawn's early light," can be assigned hexadecimal data object code values as follows:

| READ | CODE$_{(2\ hpo)}$ | WRITE |
|---|---|---|
| O | F8 | 0.0 |
| Space | 49 | 0.1 |
| s | 16 | 0.2 |
| a | 04 | 0.3 |
| y | 1C | 0.4 |
| Space | 49 | 0.5 |
| c | 06 | 0.6 |
| a | 04 | 0.7 |
| n | 11 | 0.8 |
| Space | 49 | 0.9 |
| y | 1C | 0.10 |
| o | 12 | 0.11 |
| u | 18 | 0.12 |
| Space | 49 | 0.13 |
| s | 16 | 0.14 |
| e | 08 | 0.15 |
| e | 08 | 0.16 |
| Space | 49 | 0.17 |
| b | 05 | 0.18 |
| y | 1C | 0.19 |
| Space | 49 | 0.20 |
| t | 17 | 0.21 |
| h | 0B | 0.22 |
| e | 08 | 0.23 |
| Space | 49 | 0.24 |
| d | 07 | 0.25 |
| a | 04 | 0.26 |
| w | 1A | 0.27 |
| n | 11 | 0.28 |
| ' | 44 | 0.29 |
| s | 16 | 0.30 |
| Space | 49 | 0.31 |
| e | 08 | 0.32 |
| a | 04 | 0.33 |
| r | 15 | 0.34 |
| l | 0F | 0.35 |
| y | 1C | 0.36 |
| Space | 49 | 0.37 |
| l | 0F | 0.38 |
| i | 0C | 0.39 |
| g | 0A | 0.40 |
| h | 0B | 0.41 |
| t | 17 | 0.42 |
| , | 45 | 1.0 . . . |

The data condenser and method provides inherent encryption through the assignment of unique Hexadecimal, Base-256, or other NBase values to the condensed data stored in the library (e.g. condensation file, array file, etc.). Such Hexadecimal, Base-256, or other NBase values must be known by the recipients in order to use the condensed data file(s).

The data condenser and method may enhance encryption by creating alternate start points, position shifts, false data objects, blanks, and non-linear write patterns for the data contained in the condensed data file(s).

Further, the data condenser and method may utilize a conventional encryption technique that allows the selection of the current date, current time, a key word, or other general alpha/numeric input to create a one-time key to encrypt the recording of the data. Of course, the recipient of the data must also have access to the key to unlock and utilize the data. The data condenser and method also permits users to create their own algorithms or provide added security. For example, one condensed data file could be encrypted with another condensed or standard data file.

The data condenser and method will function on a conventional computer processing unit (CPU), but will also work on other processing units, such as for example a graphical processing unit (GPU).

The inherent or special encryption provided by the data condenser and method will support the standard first-in-first-out (FIFO), but is not required to operate with that format. It is possible to start in a random area of a file and thereafter jump from coordinate to coordinate in a non-linear fashion.

In another embodiment, the condensed data file(s) (e.g. condensation file, array file, etc.) may be populated directly from the contents of a FastQ text file. For each FastQ data packet, each single character (e.g. number or letter) in line 1 is coded, followed by an end of line marker. Lines 2 and 4 of each FastQ data packet are combined to make a double letter code condensed to a hexadecimal (or NBase) data object followed by an end of line (EoL) marker, while line 3 is ignored. When condensation of all FastQ data packets is complete, an end of file marker is added. Next, the processor(s) 302 translates each single letter or double letter code into a hexadecimal (or NBase) data object, so that each condensed data file element constitutes a single hexadecimal (or NBase) data object. The remainder of the condensed data file is filled with valueless (e.g. null) hexadecimal (or NBase) data objects until the end of file marker (EoF).

In a reversion process, the hexadecimal (or NBase) data objects in the condensation file (or array file) file are reverted to the original data in the source file. In the above illustrated alternative embodiment, the processor(s) 302 is used to translate each hexadecimal (or NBase) data object into single or double letter uncondensed data objects. Each reverted FastQ data packet is now 2 lines. For each FastQ data packet: (a) all hexadecimal (or NBase) data objects are read until the end of line, (b) each hexadecimal (or NBase) data object is translated into a single letter, with a data file populated with the text, (c) the FastQ packet line 1 of text is written to a uncondensed data object, (d) all hexadecimal (or NBase) data objects are read until the end of line (EoL), (e) the FastQ packet line 2 is read into an uncondensed data file (each element will have two text character), (f) the first character of each uncondensed data file element to a line of text (FastQ packet line 2) is written, (g) a line of text with the +character (FastQ packet line 3) is written; and (h) the second character of each condensed data file element to a line of text (FastQ packet line 4) is written. The end of file marker (EoF) and all valueless hexadecimal data objects are ignored. The resulting text file is no longer condensed, and may be saved.

The data condenser and method could employ computers having different numeral systems, such as, but not limited to octal (base-8), decimal (base-10), tetradecimal (base-14), pentadecimal (base-15), hexadecimal (base-16), tetravigesimal (base-24), duotrigesimal (base-32), hexatrigesimal (base-36), tetrasexagesimal (base-64), and Duocentosexapentagesimal (base-256).

Some base-2 computers use a base-16 (hexadecimal) code to represent computer memory addresses. Such hexadecimal notation provides a human-friendly representation of binary-coded values. It uses sixteen district symbols, most often the symbols 0-9 to represent values zero to nine, and A, B, C, D, E and F (or alternatively a-f) to represent values ten to fifteen. One hexadecimal digit represents a nibble, which is half of a byte (8 bits). Byte values can range from 0 to 255 (decimal), but may be more conveniently represented as two hexadecimal digits in the range of 00 to FF.

In the Base-256 embodiment, a predetermined (e.g. predefined) reference file of 256 values is utilized to convert and condense data objects which may occur in the original data source file. In this embodiment all common characters, alpha-numeric and symbols, are included along with action characters such as but not limited to, carriage return, tab, End of File, and null. Then long terms are added, defined by the most commonly used multi-character words in the English language. The predetermined (e.g. predefined) reference file can be constructed for any language/s and/or topic/s and is not limited to English.

The Following Example Demonstrates Usage of Base-256 Predetermined Reference File.

Original file for conversion:
The big brown rabbit likes green leafy carrots; he eats them all in the garden.

The following words are common words already assigned a Base-256 value in the predetermined reference file.

| The = 130 | Likes = 131 | he = 132 | them = 133 | all = 134 |
|---|---|---|---|---|
| green = 135 | brown = 136 | big = 137 | | |

The predetermined reference file also includes all common English alphanumeric characters and symbols along with the action characters.

The data condenser then converts the original source file into the condensed data objects. The original source file contains 81 data objects (alphanumeric characters, symbols, action characters). Condensation of the original data objects reduces that number by the following method.

Two uses of 'the'=2 data objects reduced from a total of 6
'big'=1 reduced from 3
'brown'=1 reduced from 5
'likes'=1 reduced from 5
'green'=1 reduced from 5
'he'=1 reduced from 2
'them'=1 reduced from 4
'all'=1 reduced from 3

Total reduced data objects (6+3+5+5+5+2+4+3) 33 resulting in 9 condensed data objects. (81 original data objects, including End of Line and End of File−33)+9 resultant condensed data objects.

Condensed data object total=57 total data objects.

The array file is then defined with a total data object count of 57 instead of 81, the square root is determined and rounded up to the nearest whole number and the array file is populated as defined in FIG. 1 and described in steps 1.6 through 1.8 herein.

Condensation with the NBase embodiment is done with variable methods, selection of optimization by single data object or recurrence of many data objects (long read) may be chosen along with optimization methodology for a single original source file or many original files.

Short read NBase utilizes only single alphanumeric characters, symbols, and action characters when creating the optimized library.

In the following example, Short read NBase will be used to optimize a single original source file.

Original source file for conversion:

--AACCTGGTccccTTTCCGGAAAANNNNNCCccttggaaaa--

Short read optimization examines the data objects in the file and determines that there are a total of 42 including the End of Line and End of File variables. NBase then determines that the data objects used are A, C, T, G, a, c, t, g, N, End of Line, and End of File. There are a total of 11 unique data objects in the original source file, therefor the NBase condensation file will be defined as a Base-11 set, with only needing to use 11 unique data objects. The array file is the created as described in FIG. 1 and described in steps 1.6 through 1.8 herein.

Long read NBase also reads all single use alphanumeric characters, symbols, and action characters used and then proceeds to read all words and/or phrases looking for the most recursive to fill the remaining spaces in the condensation file. Once completed, the new condensation file is used to determine the official data object total for creation of the array file described in FIG. 1 and described in steps 1.6 through 1.8 herein.

NBase multiple file optimization is the same as described above with the only caveat being that instead of reading a single original source file to define the optimized condensation file, it reads more than one file to determine the optimized condensation file.

In the Base-256 (or NBase) embodiments, pack depth is the number of Base-256 (and/or NBase) assigned values that are packed into one condensed array file to be written by the method in FIG. 1 and described in steps 1.6 through 1.8 herein. Pack depth must be a positive integer +i that is greater than or equal to one (≥1).

In the below example, the items in [DO] will be designated as examples of Base-256 (or NBase) data objects that have been associated with values from a predetermined reference file. Items inside of ( ) will be consider held in a single condensed data object defined by pack depth. EoL will hold the data object reference for End of Line and EoF will hold the data object reference for End of File.

Pack depth of 1:
([DO])([DO])([DO])([DO])([DO])([DO])([DO])([DO])([DO])([DO])([DO])([EoL])([EoF])

In the above example there are 13 data objects for condensation including EoL and EoF. Thus, the array file will be defined with the square root of thirteen (13) so that an array file will be created in the manner described in FIG. 1 and described in steps 0.1.6 through 1.8 herein.

Pack depth of 2:
([DO][DO])([DO][DO])([DO][DO])([DO][DO])([DO][DO])([DO][EoL])([EoF][NULL])

In the above example there are 7 data objects for condensation including EoL and EoF. Thus, the array file that will be defined as the square root of seven (7) so that an array file will be created in the manner described in FIG. 1 and described in steps 1.6 through 1.8 herein.

Pack depth of 3:
([DO][DO][DO])([DO][DO][DO])([DO][DO][DO])([DO][DO][EoL])([EoF][NULL][NULL])

In the above example there are 5 data objects for condensation including EoL and EoF. Thus, that array file will be defined as the square root of five (5) so that an array file will be created in the manner described in FIG. 1 and described in steps 1.6 through 1.8 herein.

Pack depth of 4:
([DO][DO][DO][DO])([DO][DO][DO][DO])([DO][DO][DO][EoL])([EoF][NULL][NULL][NULL])

In the above example there are 4 data objects for condensation including EoL and EoF. Thus, that array file will be defined as the square root of four (4) so that an array file will be created in the manner described in FIG. 1 and described in steps 1.6 Through 1.8 herein.

Pack depth can be preset or manually defined in the two embodiments described above. For all intents and purposes the pack depth of the above examples could be set to thirteen (13) and the array file would be one (1) condensed data object in size with thirteen Base-256 (or NBase) values stored inside of that single array file.

FIG. 1 illustrates one method of condensation 100 of data files. As set forth in various places in the application, the system and method may be effectuated by a processor executing computer code stored in a storage medium.

The processor can comprise a microprocessor and other circuitry that retrieves and executes software from storage system. The processor can be implemented within a single processing device but can also be distributed across multiple processing devices or sub-systems that cooperate in executing program instructions. Examples of processors include general-purpose central processing units, application specific processors, and logic devices, as well as any other type of processing device, combinations of processing devices, or variations thereof.

The storage device can comprise any storage medium readable by processor, and capable of storing software. The storage system can include volatile and nonvolatile, removable and non-removable media implemented in any method or technology for storage of information, such as computer readable instructions, data structures, program modules, or other data. Storage system can be implemented as a single storage device but may also be implemented across multiple storage devices or subsystems. Storage system can further include additional elements, such as a controller capable of communicating with the processor.

Examples of storage media include a random access memory, read only memory, magnetic disks, optical disks, flash memory, virtual memory, and non-virtual memory, magnetic sets, magnetic tape, magnetic disk storage or other magnetic storage devices, or any other medium which can be used to store the desired information and that may be accessed by an instruction execution system, as well as any combination or variation thereof, or any other type of storage medium.

Step 1.0 involves the launch of the condensation software. The code for the condensation of the source file(s) is executed, run, and/or initiated based on the operating system platform it resides on. Upon this action, the condensation software will load appropriate components into active memory (RAM) and ancillary components onto fixed or portable storage media for use as needed during the course of the condensation processes.

Step 1.1 involves the selection of the source file(s) to condense, identified hereafter as source file(s). The selection of the source file(s) is made through the condensation software menus. This may include but is not limited to a browsing menu dialog box, drag and drop of a file(s) into the condensation software, and/or an open and select file(s) option. This loads the file(s) for condensation and creates the linkage to the source file(s) for the process of condensation.

Step 1.2 involves the analysis of the source file(s). Source file(s) analysis may include one or more of the following and is not limited to the examples listed:

Count of all data objects residing in the source file(s).

Assessment of internal formatting (e.g. spreadsheet, FastQ file, etc.)

Recursive data objects identification (e.g. define groups)

Predetermined/Inherited data object identification (e.g. from predetermined reference file)

Predetermined/Manually entered algorithm (e.g. numerical base coding system)

When all criteria are met either by default or manually determined methods, the total of those data objects (e.g., one or more ASCII text characters) will be set and known, permitting the process to move to the next step in condensation.

Step 1.3 initiates optional optimization of the predetermined reference file(s) and condensation file(s). Based on source file analysis, the option exists to customize the predetermined reference file(s) (and condensation file(s)) by associating Hexadecimal, Base-256, or other NBase values with a data object(s), and the selection of a pack depth other than the default value of 3 for the array file. Customized methods of optimizing the condensation may be manually specified or automatically selected.

Step 1.4 relates to establishment of an array file(s) to hold condensed data. The whole of the known data object(s) is a whole number. The square root of the data objects is derived. This is used to determine the parameters for the X and Y axes of the array file(s). Due to the fact that the majority of square roots involve the usage of decimal places, the derived square root of the total condensed data objects is rounded up to the nearest whole number so that the array file(s) is always large enough to handle the condensation of the source file(s), but never wastes more space than the additional need for less than one additional row of data objects. Given the square root of the data objects rounded up to the nearest whole number, the condensed array file(s) will be defined as whole number value for both the X and Y Axes. This prepares virtual memory for the process of forming the array.

Step 1.5 initiates the condensation process. Initiation of condensation on the source file(s) begins with the acknowledgment to proceed.

Step 1.6 relates to reading the assessed data objects into the source file for processing. The reading of data objects for condensation takes place as one or more methods, but is not limited to the examples listed:

One data object at a time

Based on optimization analysis performed in step 1.3

Predetermined/Inherited structures

The data objects are read into active memory for condensation processing.

Step 1.7 relates to addressing the source file to obtain Hexadecimal, Base-256 or other NBase values defined for assessed data objects and/or groups of data objects. The data objects in active memory are compared to the predetermined reference file(s) which hold a designated Hexadecimal, Base-256 or other NBase value assignment for the data object(s) contained in the original source file(s).

Step 1.8 relates to populating the condensation file(s) with coded data. Write of Hexadecimal, Base-256 or other NBase values may be written to the condensation file(s) in varying methods, but is not limited to the examples listed:

Left to right, top to bottom (default);

Counter clockwise from the center;

A custom design and assigned pattern; and/or

Fractal methodology

Stream

Based on optimization analysis performed in step 1.3

Step 1.9 refers to the conversion cycle. The population of the condensation file(s) will continue until there are no additional data objects to read from the source file(s). The condensation file(s) will continue to populate if additional data objects are encountered (see step 1.6) and proceed again through steps 1.7 and 1.8. If no additional data objects are encountered, the process will proceed to step 1.10, which terminates the cyclical process. When this occurs the process proceeds to the file completion protocols.

Step 1.10 relates to marking the end of the condensation file(s). A Hexadecimal, Base-256 or other NBase value is assigned to the end of file terminator. This Hexadecimal, Base-256 or other NBase value is never shared with any other Hexadecimal, Base-256 or other NBase value assignments, but may vary in the actual designated Hexadecimal, Base-256 or other NBase value assigned for a broad range of reasons. This Hexadecimal, Base-256 or other NBase value is used only once in a data file.

Step 1.11 relates to populating the remaining file space in the condensation file(s) with a Hexadecimal, Base-256 or other NBase value for null. Null also known as empty space and is similar to end of file, however, since end of file may only be used once as a terminator; any remaining space in the condensation file(s) residing in virtual memory must be populated per the structural requirements of the condensed file(s). A Hexadecimal, Base-256 or other NBase value is assigned to null. This value is never shared with any other Hexadecimal, Base-256 or other NBase value assignments, but may vary in the actual designated Hexadecimal, Base-256 or other NBase value assigned for a broad range of reasons.

Step 1.12 relates to naming the condensation file(s). The condensation output file(s) may be stored on any fixed or portable storage media that has sufficient write space necessary for the condensed file(s). A name may be determined for the condensed file(s) at this time. This naming has no specific requirements and may be determined ad hoc or by an externally determined standard.

Step 1.13 writes the condensation file(s) to disk for storage. The condensation file(s) in active memory is written to storage on fixed or portable storage media and is now referred to as the condensed data output file. The condensation file(s) may be accessed as necessary from fixed or portable storage media without modification in its new condensed state.

Step 1.14 closes the source file(s) and condensation file(s). Source file(s) and condensation file(s) are released from active memory.

Step 1.15 closes the condensation software. Condensation software is released from active memory. Any temporary data files used in the software's execution are deleted.

FIG. 2 illustrates one method of reversion 200 of the condensed data to its original un-condensed state.

Step 2.0 relates to the launching of the reversion program. The code for the reversion of the condensed file(s) is executed, run, and/or initiated based on the operating system platform it resides on. Upon this action, the reversion software will load appropriate components into active memory (RAM) and ancillary components onto fixed or portable storage media for use as needed during the course of the reversion processes. Reversion use revolves around the need to quickly view some of the condensed file(s) in a virtual environment or reversion to a full source file(s) for transfer to a system or entity that does not have equivocal condensed data file technology available.

Step 2.1 relates to the selection of the condensation (e.g. condensed file or reversion file) file(s) through the reversion software menus. The selection of the condensation file(s) is made through the reversion software menus. This may include but is not limited to a browsing menu dialog box, drag and drop of a condensation file(s) into the reversion software, and/or an open and select condensation file(s) option. This loads the condensation file(s) for reversion and creates the linkage to the condensation file(s) for the process of reversion.

Step 2.2 relates to the amount of condensed data file(s) to revert. The user may specify a certain amount less than 100% of the condensation file(s) to revert. This amount may be a selected percentage, line number, or other unlisted method.

Step 2.3 relates to the selection of output method. The user may specify output to an output data file(s) (e.g. destination or virtual file) or viewing window on a visual medium. The output data file(s) may be stored on any fixed or portable storage media that has sufficient write space necessary for the output data file(s). A name may be determined for the output data file(s) at this time. This naming has no specific requirements and may be determined ad hoc or by an externally determined standard.

Step 2.4 relates to the reading of the condensation file(s). The condensation file(s) is read using one of the following methods, but is not limited to the examples listed.
  Left to right top to bottom (default)
  Counter clockwise from the center
  Algorithmically assigned pattern
  Fractal methodology
  As determined by library
  Stream Step 2.5 relates reading a Hexadecimal, Base-256 or other NBase value from the condensation file. A Hexadecimal, Base-256 or other NBase value is read from the condensation file(s).

Step 2.6 refers to the consultation of the advanced reference file and the pack depth specified in the condensation file. A Hexadecimal, Base-256 or other NBase value is qualified against the library. The library links a Hexadecimal, Base-256 or other NBase value with an assigned data object associated with the original source file(s).

Step 2.7 refers to the writing of the reverted data objects to a destination data file(s) in memory. The reverted data objects then populated into a destination file(s) in one or more of the following methods, but not limited to the examples in the list.
  Reversion of a predetermined/manually entered algorithm
  Identified recursive structural entities
  Format specific
  As determined by library
  Stream The destination file(s) resides in active memory (RAM). The population of the destination file(s) will continue until the end of file (EoF) Hexadecimal, Base-256 or other NBase value (1.11) is encountered in the condensation file(s). The destination file(s) will be formatted in a manner that is the same as the original source file(s) prior to condensation, this original source file(s) may be a file of one of the following types, but is not limited to the examples listed:

Word, Excel, Text Files
  Database Files
  Electronic Medical Records
  Log Files
  FASTQ/Genomics Files
  Binary Files Step 2.8 refers to the reversion cycle. A write cycle is defined as a single instance in which the reversion software must write information to active memory or fixed or portable storage media. If system limitations will accommodate the writing of the user specified amount in 2.2 or the entire destination file to active memory (RAM), the reversion software will recognize that only a single write cycle is needed and population of the destination file(s) will continue until there are no additional Hexadecimal, Base-256 or other NBase values to read from the condensation file(s). If system limitations will not accommodate the writing of the user specified amount in 2.2 or the entire destination file to active memory (RAM), the reversion program will calculate an amount of write cycles greater than one (1) that will allow for population of the destination file(s) in parts. Determination of how the size of a write cycle should be calculated can be, but is not limited to, one of the following methods:
  By end of line in the condensed data file
  By a fraction or percentage of the condensed file
  Using a fraction or percentage of available RAM Step 2.9 refers to the determination of the reversion software that it has reached the end of its final write cycle. If the end of the final write cycle has been reached, the reversion software proceeds to step 2.10. If the end of the final write cycle has not been reached, the reversion software proceeds to step 2.9.5

Step 2.9.5 refers to the writing of the destination file to a temporary data file on fixed or portable storage media. Temporary data file characteristics follow the same specifications and restrictions as the destination files described in step 2.7

Step 2.10 refers to the earlier choice of data file(s) output or viewer output. (step 2.3) The process diverges at this point between output to data file(s) or viewer.

Step 2.11 relates to the finalization of writing of the destination file(s) to fixed or portable storage media. Temporary data file(s) involved with the reversion process and the destination file(s) in active memory are combined and written to fixed or portable storage media. The destination file(s) now resides as a data file which may be accessed as necessary from fixed or portable storage media.

Step 2.12 closes source and output data files. Source and output data files are released from active memory. Temporary data files involved in the reversion process are deleted from fixed or portable storage media.

Step 2.13 refers to the creation of a viewing window if visual viewing has been chosen (step 2.3). Create a process in active memory that is capable of viewing the destination file.

Step 2.14 refers to the output of a reverted destination file(s) to the viewer window created in step 2.13. Temporary data file(s) involved with the reversion process and the destination file(s) in active memory are combined and prepared for viewing in the viewer window. This is the transmission for display on a visual medium for inspection, or diagnosis/review of content.

Step 2.15 closes the source destination file(s) and viewer window. Destination file(s) and viewing window are released from active memory. Temporary data files involved in the reversion process are deleted from fixed or portable storage media.

Step 2.16 closes the reversion software. Reversion software is released from active memory. Any temporary files used in the software's execution are deleted.

In the foregoing description, certain terms have been used for brevity, clearness, and understanding. No unnecessary limitations are to be inferred therefrom beyond the requirement of the prior art because such terms are used for descriptive purposes and are intended to be broadly construed. The different configurations, systems, and method steps described herein may be used alone or in combination with other configurations, systems and method steps. It is to be expected that various equivalents, alternatives and modifications are possible within the scope of the appended claims.

What is claimed is:

1. A lossless data condenser for reducing data storage and handling requirements comprising:
   a data memory including:
      a source file having data objects to be restructured and condensed;
      a predetermined reference file having predetermined coded data objects and predetermined coded data object groups, wherein each predetermined data object and each predetermined data object group is assigned a first unique code;
      an advanced reference file having algorithmically selected data objects and algorithmically selected data object groups obtained from at least one of the source file and the predetermined reference file; and
      a condensation file including a structured array of restructured condensed data objects and restructured condensed data object groups, wherein a pack depth for the array defines a number of the restructured condensed data objects and restructured condensed data object groups packed in the structured array; and
   a condensation processor operative to:
      analyze the source file to create data object groups, wherein each created data object group contains a plurality of data objects based on repetitive patterns of data objects within the source file;
      determine each data object remaining in the source file that is not part of a created data object group;
      select a pack depth for the array based at least in part on a count of the data objects in the source file;
      modify the advanced reference file to include any unique data objects and unique created data object groups which are not contained in the predetermined reference file;
      select a coding system for the data objects and data object groups added to the advanced reference file;
      assign a second unique code from the selected coding system to each added data object and each added data object group to the advanced reference file;
      initialize the structured memory array, wherein the structured memory array is defined by the selected pack depth and a square root of a total number of restructured condensed data objects to be stored in the structured memory array rounded up if necessary to establish a whole number for an x-axis and a y-axis of the structured memory array, wherein the total number of restructured condensed data objects is a sum divided by the selected pack depth, the sum being a total number of data objects, data object groups, and at least one end file data;
      for each data object and data object group in the source file, determine a unique code for the corresponding data object and corresponding data object group from the predetermined reference file or the advanced reference file, wherein the data objects and data object groups in the source file become coded data objects and coded data object groups;
      populate the structured memory array, in order, with the coded data objects and coded data object groups from the source file, wherein the coded data objects and coded data object groups from the source file become restructured condensed data objects when populated into the structured memory array, wherein each restructured condensed data object populated into the structured memory array is defined by the selected pack depth of the structured memory array; and
      fill a remainder of the structured memory array with a null coded data, once an end of the source file is reached,
   wherein the lossless data condenser allows efficient and accurate lossless data storage and transfer.

2. The lossless data condenser in claim 1, wherein the condensation processor has a base-256 coding system assigned to predetermined data objects and data object groups and a base-16 coding system assigned to non-predetermined data objects and data object groups.

3. A method for lossless data condensation of data objects such as numbers, letters, words, phrases and other indicia to allow efficient and accurate secure data evaluation, data storage and data transfer, comprising:
   obtaining a collection of data objects to be condensed;
   placing the collection of data objects into a source file;
   conducting an analysis of the source file including counting a total number of data objects;
   reading the source file and creating data object groups, each data object group containing one or more data objects in response to repetitive patterns of data objects within the source file;
   counting a total number of data object groups;
   counting a total number of remaining data objects which are not part of a data object group;
   receiving one or more library reference files of a set of predefined data objects and a set of predefined data object groups;
   modifying the one or more library reference files to include any data objects and any created data objects groups not already contained in the one or more library reference files;
   selecting one or more numerical base coding systems based on a number of the predefined data objects and the predefined data object groups in the one or more library reference files;
   assigning a first unique code from the one or more selected numerical base coding systems to each predefined data object and each predefined data object group;
   selecting a numerical based coding system for the data object groups added to the one or more library reference files;
   assigning a second unique code from the selected numerical based coding system to each added data object group to the one or more library reference files;
   selecting a pack depth for a structured memory array, wherein the structured memory array is defined by the pack depth and a square root of a total number of restructured condensed data objects to be stored in the structured memory array rounded up if necessary to establish a whole number of an x-axis and a y-axis of the structured memory array, wherein the total number of restructured condensed data objects is a sum divided by the pack depth, the sum being a total number of data objects, data object groups, and at least one end of file data object;

for each data object and data object group in the source file, determining the first or second unique code for the corresponding data object and corresponding data object group in the one or more library reference files, wherein the data objects and data object groups in the source file become coded data objects and coded data object groups;

populating the structured memory array, in order, with the coded data objects and coded data object groups from the source file, wherein the coded data objects and coded data object groups become restructured condensed data objects when populated into the structured memory array, wherein each restructured condensed data object is defined by the pack depth of the structured memory array; and filling a remainder of the structured memory array with a null coded data, once an end of the source file is reached; and placing the structured memory array, containing the restructured condensed data objects, on storage media.

\* \* \* \* \*